US012315743B2

(12) United States Patent
Lee et al.

(10) Patent No.: US 12,315,743 B2
(45) Date of Patent: May 27, 2025

(54) SUBSTRATE TREATING METHOD AND SUBSTRATE TREATING APPARATUS

(71) Applicant: SEMES CO., LTD., Cheonan-si (KR)

(72) Inventors: Ki Yung Lee, Suwon-si (KR); Dongbock Lee, Suwon-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 18/452,918

(22) Filed: Aug. 21, 2023

(65) Prior Publication Data

US 2023/0395399 A1    Dec. 7, 2023

Related U.S. Application Data

(63) Continuation of application No. 16/912,979, filed on Jun. 26, 2020, now abandoned.

(30) Foreign Application Priority Data

Jun. 27, 2019   (KR) .................. 10-2019-0076764

(51) Int. Cl.
*H01L 21/67* (2006.01)
*C23C 16/455* (2006.01)
(Continued)

(52) U.S. Cl.
CPC ...... *H01L 21/67063* (2013.01); *C23C 16/455* (2013.01); *C23C 16/45565* (2013.01);
(Continued)

(58) Field of Classification Search
CPC ............... C21D 9/54; C23C 16/45565; C23C 16/45574; C23C 16/455; C23C 16/4412;
(Continued)

(56) References Cited

U.S. PATENT DOCUMENTS 9,583,315 B2   2/2017   Tsujimoto et al.
9,845,961 B2   12/2017  Saito et al.
(Continued)

FOREIGN PATENT DOCUMENTS

CN    101488446 A    7/2009
CN    101660138 A    3/2010
(Continued)

OTHER PUBLICATIONS

Office Action for Korean Application No. 10-2019-0076764 dated Aug. 31, 2020.
(Continued)

*Primary Examiner* — Jeffrie R Lund
(74) *Attorney, Agent, or Firm* — Harness, Dickey & Pierce, P.L.C.

(57) ABSTRACT

The apparatus includes a chamber having a treating space for treating the substrate, a substrate support unit for supporting the substrate in the treating space, a gas supply unit for supplying gas into the treating space, and a plasma source for generating plasma from the gas supplied to the treating space, wherein the gas supply unit includes a shower head unit disposed in a top portion of the chamber so as to face away the substrate support unit, wherein a plurality of discharge holes are defined in the shower head unit, wherein the gas is discharged through the discharge holes, and a gas block for supplying the gas to the shower head unit, wherein the shower head unit has partitioned regions defined therein communicating with the discharge holes respectively, wherein the gas block supplies the gas to the partitioned regions at different flow rates.

5 Claims, 6 Drawing Sheets

(51) Int. Cl.
*H01J 37/32* (2006.01)
*H01L 21/3065* (2006.01)
*H01L 21/683* (2006.01)

(52) U.S. Cl.
CPC .... *H01J 37/32009* (2013.01); *H01J 37/3244* (2013.01); *H01J 37/32449* (2013.01); *H01L 21/3065* (2013.01); *H01L 21/683* (2013.01)

(58) Field of Classification Search
CPC .............. C23C 16/4557; H01J 37/3244; H01J 37/32449; H01J 2237/334; H01J 37/32009; H01L 21/3065; H01L 21/67063; H01L 21/67103; H01L 21/67109; H01L 21/683; H01L 21/6831; H01L 21/67069; H05H 1/24
USPC ............... 156/345.3, 345.33, 345.34, 345.38
See application file for complete search history.

(56) References Cited

U.S. PATENT DOCUMENTS

| | | |
|---|---|---|
| 2007/0295272 A1 | 12/2007 | Padhi et al. |
| 2014/0103145 A1 | 4/2014 | White et al. |
| 2016/0056021 A1 | 2/2016 | Tsujimoto et al. |
| 2017/0301518 A1 | 10/2017 | Hosaka et al. |
| 2018/0061615 A1 | 3/2018 | Kim et al. |
| 2018/0130640 A1 | 5/2018 | Gregor et al. |
| 2019/0067031 A1 | 2/2019 | Shimizu et al. |
| 2019/0108984 A1 | 4/2019 | Morishima et al. |
| 2020/0411337 A1 | 12/2020 | Lee et al. |
| 2023/0395399 A1* | 12/2023 | Lee .................. C23C 16/4412 |

FOREIGN PATENT DOCUMENTS

| | | |
|---|---|---|
| CN | 112930580 A | 6/2021 |
| EP | 1167571 A2 | 1/2002 |
| JP | 2010-245512 A | 10/2010 |
| KR | 2008-0068592 A | 7/2008 |
| KR | 2014-0063684 A | 5/2014 |
| KR | 2015-0035247 A | 4/2015 |
| KR | 10-1596930 B1 | 2/2016 |
| KR | 2017-0006841 A | 1/2017 |
| KR | 2017-0026940 A | 3/2017 |
| KR | 2017-0039797 A | 4/2017 |
| KR | 2018-0004474 A | 1/2018 |
| KR | 2018-0014583 A | 2/2018 |
| KR | 2019-0045714 A | 5/2019 |
| KR | 2019-0048531 A | 5/2019 |
| TW | 202108254 A | 3/2021 |
| WO | WO-03031678 A1 | 4/2003 |

OTHER PUBLICATIONS

Chinese Office Action dated May 1, 2024 issued in Chinese Patent Application No. 202010598581.9.

* cited by examiner

SUBSTRATE TREATING METHOD AND SUBSTRATE TREATING APPARATUS

CROSS-REFERENCE TO RELATED APPLICATIONS

This application is a continuation of U.S. application Ser. No. 16/912,979, filed on Jun. 26, 2020, which claims priority under 35 U.S.C. § 119 to Korean Patent Application No. 10-2019-0076764 filed on Jun. 27, 2019 in the Korean Intellectual Property Office, the entire contents of each of which are hereby incorporated by reference.

BACKGROUND

Embodiments of the inventive concept described herein relates to a substrate treating method and a substrate treating apparatus, and more particularly, to a substrate treating method and a substrate treating apparatus for treating a substrate using gas.

In a process of manufacturing a semiconductor device, various processes such as photographing, etching, thin-film deposition, ion implantation, and cleaning are performed. A substrate treating apparatus using gas is used for etching, thin-film deposition, ion implantation, and cleaning processes among the above processes.

In general, a gas treating process includes supplying process gas into a chamber to treat a substrate using the process gas. A shower head having a size similar to that of the substrate is placed above the substrate such that the process gas is uniformly supplied onto an entire region of the substrate. The shower head has a plurality of discharge holes defined in a surface thereof facing the substrate. Thus, a process gas is supplied from each discharge hole to the substrate to treat the substrate using the process gas.

In general, the discharge holes have the same shape and supply the gas at the same flow rate. However, during the process, a portion of the process gas reacts with the shower head to change a size of the discharge hole. For example. The process gas may act as an etching gas to remove a film of the substrate, and the process gas may etch the shower head.

In particular, the discharge extends from an inner end to a discharge end, and the discharge end is exposed to a space where the substrate is treated. Accordingly, as shown in FIG. 1, a discharge end 2a is exposed to a larger amount of the etching gas than an inner end 2b is exposed. Thus, as the process repeats, discharge end 2a has a larger diameter than that of the inner end 2b.

As a result, the discharge holes discharge the process gas at different flow rates, which causes uneven gas treatment. In particular, the gas from a central region of a shower head 2 may have a lower gas flow rate than the gases from other regions thereof. In this case, as shown in FIG. 2, the process gas is exhausted from the central region but does not reach the substrate.

SUMMARY

Embodiments of the inventive concept provide an apparatus and a method capable of uniformly treating a substrate using a process gas.

Moreover, embodiments of the inventive concept provide an apparatus and a method in which a process gas is discharged at an uniform rate across regions.

The purposes of the inventive concept are not limited thereto. Other purposes as not mentioned will be clearly understood by those skilled in the art from following descriptions.

According to an exemplary embodiment, an apparatus for treating a substrate includes a chamber having a treating space for treating the substrate, a substrate support unit for supporting the substrate in the treating space, a gas supply unit for supplying gas into the treating space, and a plasma source for generating plasma from the gas supplied to the treating space, wherein the gas supply unit includes a shower head unit disposed in a top portion of the chamber so as to face away the substrate support unit, wherein a plurality of discharge holes are defined in the shower head unit, wherein the gas is discharged through the discharge holes, and a gas block for supplying the gas to the shower head unit, wherein the shower head unit has partitioned regions defined therein communicating with the discharge holes respectively, wherein the gas block supplies the gas to the partitioned regions at different flow rates.

The apparatus may further include a controller to control the gas block, wherein when viewed from above, the partitioned regions includes: a first region containing a center, and a second region surrounding the first region, wherein the gas block includes a body having a first fluid channel defined therein connected to the first region and a second fluid channel defined therein connected to the second region, a first adjuster for adjusting a flow rate of gas flowing in the first fluid channel to be a first flow rate, and a second adjuster for adjusting a flow rate of gas flowing in the second fluid channel to be a second flow rate, wherein the controller may control the first and second adjusters such that the first flow rate and the second flow rate are different from each other.

The controller may control the first and second adjusters such that the first flow rate is higher than the second flow rate.

The controller may control the first adjuster to increase the first flow rate as a number of processes to treat the substrate increases.

The controller may control the second adjuster to increase the second flow rate as a number of processes to treat the substrate increases.

The controller may control the first and second adjusters to increase the first and second flow rates respectively such that a flow rate of gas to be supplied to a space between the shower head unit and the substrate support unit is constant.

According to an exemplary embodiment, a method for treating a substrate includes discharging a process gas from first and second partitioned regions defined in the shower head unit toward a substrate, thereby to treat the substrate using the process gas, wherein first and second flow rates of the gas to be supplied to the first region and the second region respectively are different from each other.

When viewed from above, the first region may contain a center, and the second region may surround the first region, wherein the second flow rate is lower than the first flow rate.

The substrate may include first to N-th substrates (n is a natural number larger than 2), wherein treating the substrate using the process gas includes treating the first to N-th substrates sequentially using the process gas, wherein the first flow rate during a process for treating the N-th substrate is higher than the first flow rate during a process for treating the first substrate.

The process gas may include etching gas to etch the substrate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
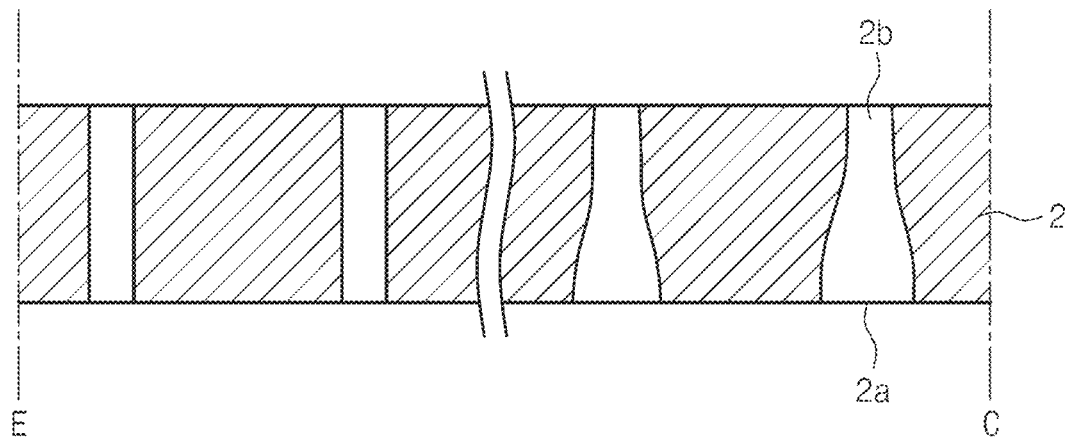
FIG. 1 is a view showing a discharge hole of a conventional shower head.
Figure 2:
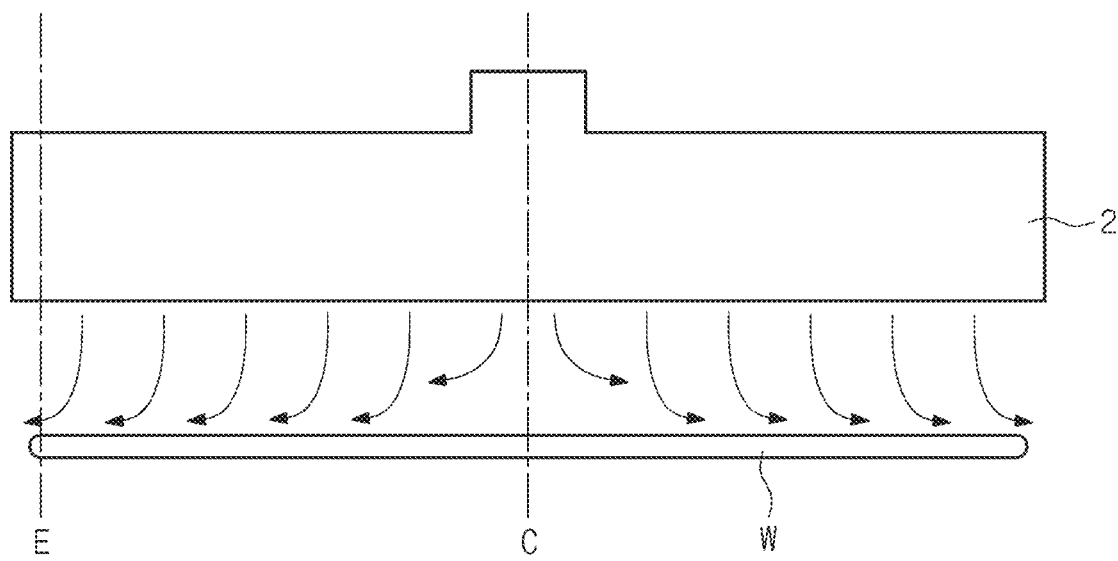
FIG. 2 is a view showing flow of gas discharged from the shower head of FIG. 1.

Hereinafter, embodiments of the inventive concept will be described in more detail with reference to the accompanying drawings. The embodiments of the inventive concept may be modified in various forms, and a scope of the inventive concept should not be interpreted as being limited to following embodiments. The embodiments are configured to more fully convey the inventive concept to those of ordinary skill in the art. Therefore, a shape of each of elements in the drawings is exaggerated to emphasize a clearer illustration.

In this embodiment, a substrate treating apparatus for etching a substrate using plasma in a chamber will be described as one example. However, the inventive concept is not limited thereto. Any apparatus that treats a substrate using gas discharged from a shower head unit may be applied to various processes.

Hereinafter, the inventive concept will be described with reference to FIG. 3 to FIG. 8.

Figure 3:
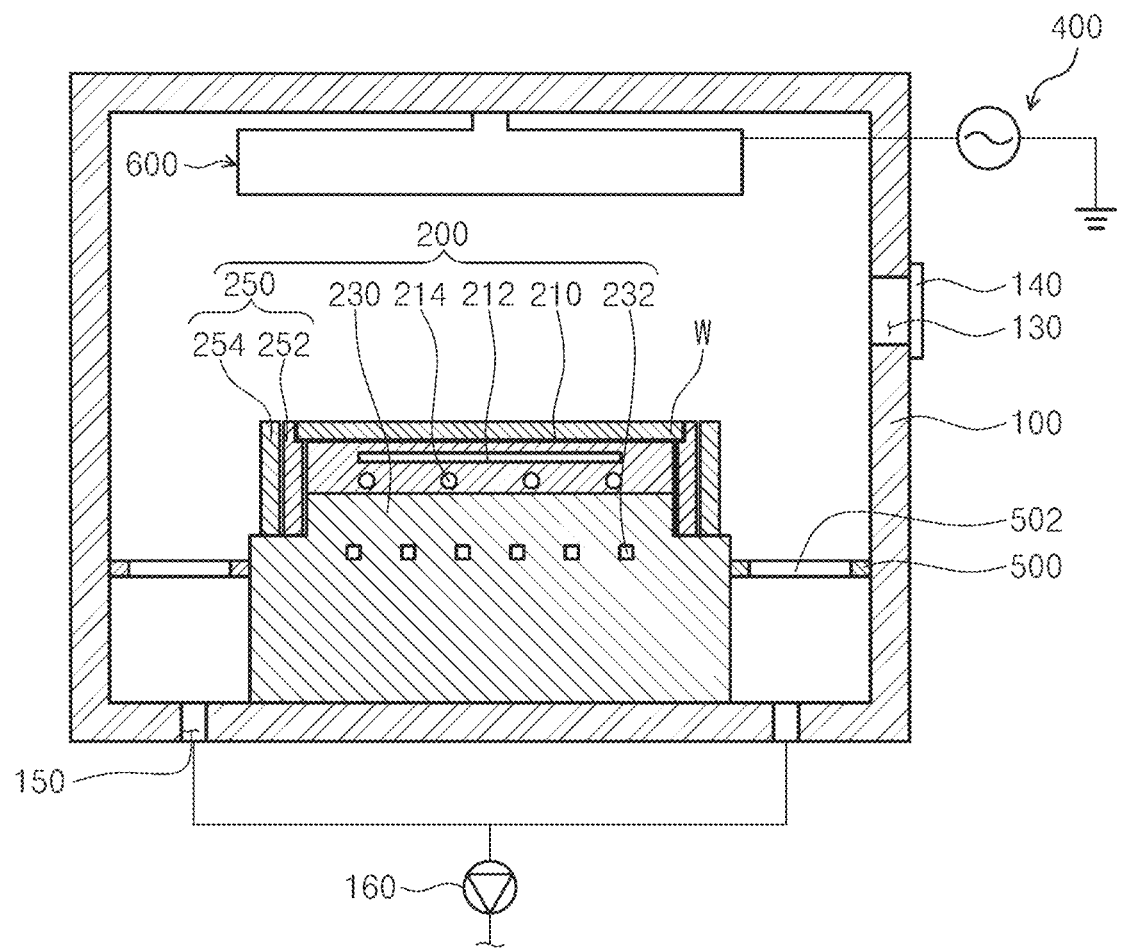
FIG. 3 is a cross-sectional view showing a substrate treating apparatus according to an embodiment of the inventive concept.

FIG. 3 is a cross-sectional view showing a substrate treating apparatus according to an embodiment of the inventive concept. Referring to FIG. 3, a substrate treating apparatus 10 includes a chamber 100, a substrate support unit 200, a plasma source 400, a baffle 500, a gas supply unit 600, and a controller 900.

The chamber 100 provides a treating space in which a substrate W is treated. The chamber 100 has a circular cylinder shape. The chamber 100 is made of metal material. For example, the chamber 100 may be made of aluminum material. An opening 130 is formed in one side wall of the chamber 100. The opening 130 is embodied as an entrance 130 through which the substrate W may be brought into the chamber and may be taken out from the chamber. The entrance 130 may be opened and closed by the door 140. An exhaust hole 150 is formed in a bottom surface of the chamber 100. The exhaust hole 150 is connected to a decompression member 160 via an exhaust line. The decompression member 160 provides a vacuum pressure to the exhaust hole 150 via the exhaust line. By-products generated during the process and plasma remaining in the chamber 100 are discharged outside the chamber 100 using the vacuum pressure.

The substrate support unit 200 supports the substrate W in the treating space. The substrate support unit 200 may be embodied as an electrostatic chuck 200 for supporting the substrate W using an electrostatic force. Optionally, the substrate support unit 200 may support the substrate W in various schemes such as mechanical clamping.

The electrostatic chuck 200 includes a dielectric plate 210, a focusing ring 250, and a base 230. The substrate W is placed directly on a top surface of the dielectric plate 210. The dielectric plate 210 has a disc shape. The dielectric plate 210 may have a radius smaller than that of the substrate W. An inner electrode 212 is installed inside the dielectric plate 210. A power source (not shown) is connected to the inner electrode 212, and power is applied from the power source (not shown) thereto. The inner electrode 212 provides an electrostatic force using an applied power (not shown) so that the substrate W is suctioned onto the dielectric plate 210. Inside the dielectric plate 210, a heater 214 for heating the substrate W is installed. The heater 214 may be located under the inner electrode 212. The heater 214 may be embodied as a coil in a spiral shape. For example, the dielectric plate 210 may be made of a ceramic material.

The base 230 supports the dielectric plate 210 thereon. The base 230 is located below the dielectric plate 210, and is fixedly coupled to the dielectric plate 210. A top surface of base 230 has a stepped shape such that a central region thereof is higher than an edge region thereof. The base 230 has an central region of the top surface having an area corresponding to an area of a bottom surface of the dielectric plate 210. A cooling fluid channel 232 is formed inside the base 230. The cooling fluid channel 232 is embodied as a passage through which a cooling fluid circulates. The cooling fluid channel 232 may have a spiral shape inside the base 230. The base is connected to a high-frequency power source 234 located outside the base. The high-frequency power source 234 applies power to the base 230. The power applied to the base 230 guides plasma generated in the chamber 100 to move toward the base 230. The base 230 may be made of a metal material.

The focusing ring 250 focuses the plasma onto the substrate W. The focusing ring 250 includes an inner ring 252 and an outer ring 254. The inner ring 252 has an annular ring shape surrounding the dielectric plate 210. The inner ring 252 is located on an edge region of the base 230. A top surface of the inner ring 252 is configured to have the same vertical level as that of a top surface of the dielectric plate 210. A top surface of an inner portion of the inner ring 252 supports a bottom surface of an edge region of the substrate W. For example, the inner ring 252 may be made of a conductive material. The outer ring 254 has an annular ring shape surrounding the inner ring 252. The outer ring 254 is located adjacent to the inner ring 252 on the edge region of the base 230. A top surface of the outer ring 254 has a vertical level higher than that of the top surface of the inner ring 252. The outer ring 254 may be made of an insulating material.

The plasma source 400 excites the process gas in the chamber 100 into a plasma state. In one example, the plasma source 400 may be embodied as a capacitively coupled plasma (CCP) source. The plasma source 400 may include an upper electrode and a lower electrode (not shown) inside the chamber 100. An upper electrode 420 and the lower electrode may be arranged vertically and may be parallel to each other in an interior of the chamber 100. A high-frequency power may be applied to one of the upper and lower electrodes, while the other electrode may be grounded. An electromagnetic field may be generated in a space between both electrodes, and thus the process gas supplied to this space may be excited into a plasma state. In one example, the upper electrode 420 may be disposed in a shower head 650, and the lower electrode may be disposed in the base. The high-frequency power may be applied to the lower electrode, and the upper electrode 420 may be grounded. Alternatively, the high-frequency power may be applied to both the upper and lower electrodes. Thus, the electromagnetic field is generated between the upper electrode 420 and the lower electrode. The generated electromagnetic field excites the process gas contained inside chamber 100 into the plasma state.

Figure 4:
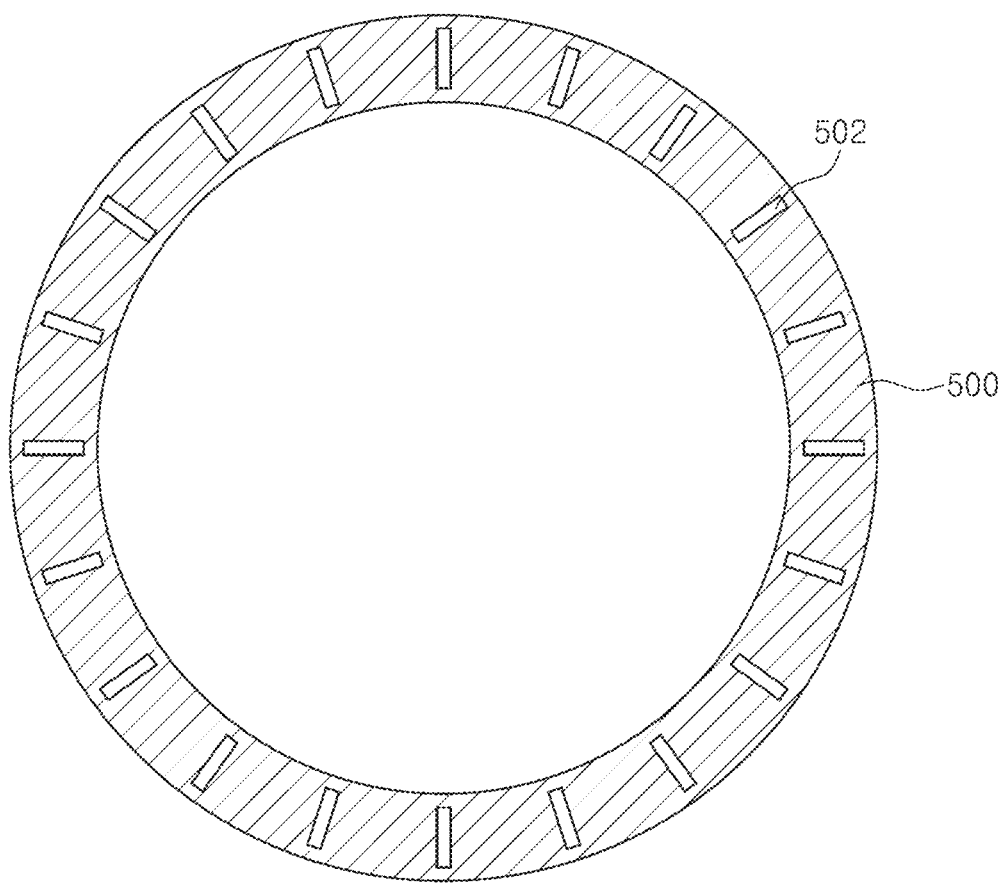
FIG. 4 is a plan view showing a baffle of FIG. 3.

The baffle 500 uniformly exhausts the plasma across the regions in the treating space in a separate manner. FIG. 4 is a plan view showing the baffle in FIG. 3. Referring to FIG. 4, the baffle 500 is located between an inner wall of the chamber 100 and a substrate support unit 400 in the treating space. The baffle 500 has an annular ring shape. A plurality of through-holes 502 are formed in the baffle 500. Each of the through-holes 502 may extend in the vertical direction. The through-holes 502 are arranged along a circumferential direction of the baffle 500. Each of the through-holes 502 has a slit shape extending in a radial direction of the baffle 500.

The gas supply unit 600 supplies the process gas into the treating space. The gas supply unit 600 includes a shower head unit 600 and a gas block 800. The shower head unit 600 is positioned above the substrate W located on the substrate support unit 400 and faces away the substrate W. The shower head unit 600 has a plurality of discharge holes 712 defined in a bottom surface thereof facing the substrate W. The shower head unit 600 is installed on an upper wall of the chamber 100. In one example, the shower head unit may be positioned so that a central axis thereof coincides with a central axis of the chamber 100. For example, the process gas may be etching gas.

The gas block 800 supplies the process gas to the shower head unit 600. The shower head unit 600 has a plurality of regions partitioned from each other defined in the shower head unit 600. These regions are in communication with the discharge holes 712. The gas block 800 supplies the process gas to each of the partitioned regions. The gas block 800 supplies the process gas to the regions at different flow rates.

Figure 5:
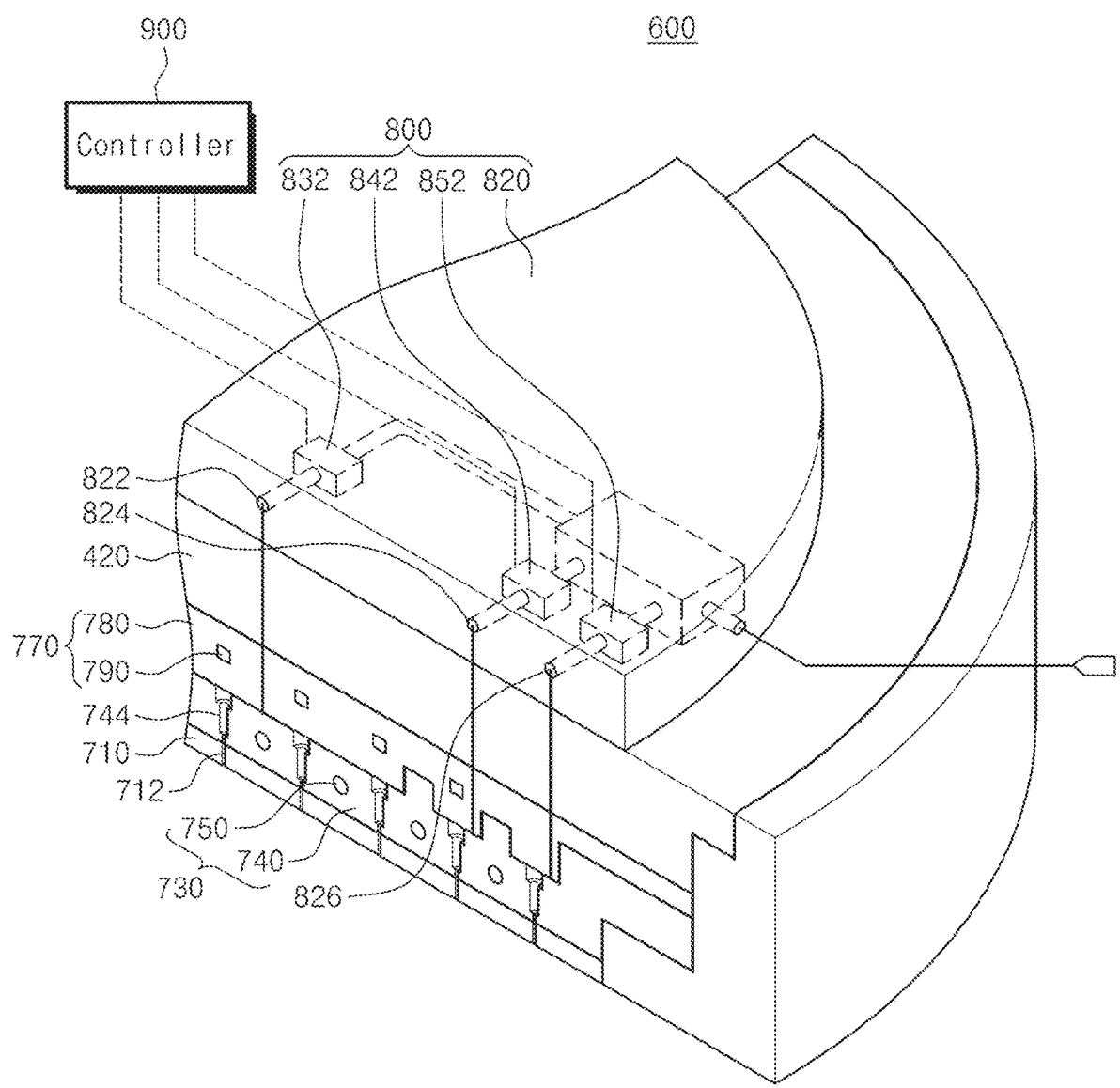
FIG. 5 is a cut-out perspective view schematically showing a shower head unit of FIG. 3.
Figure 6:
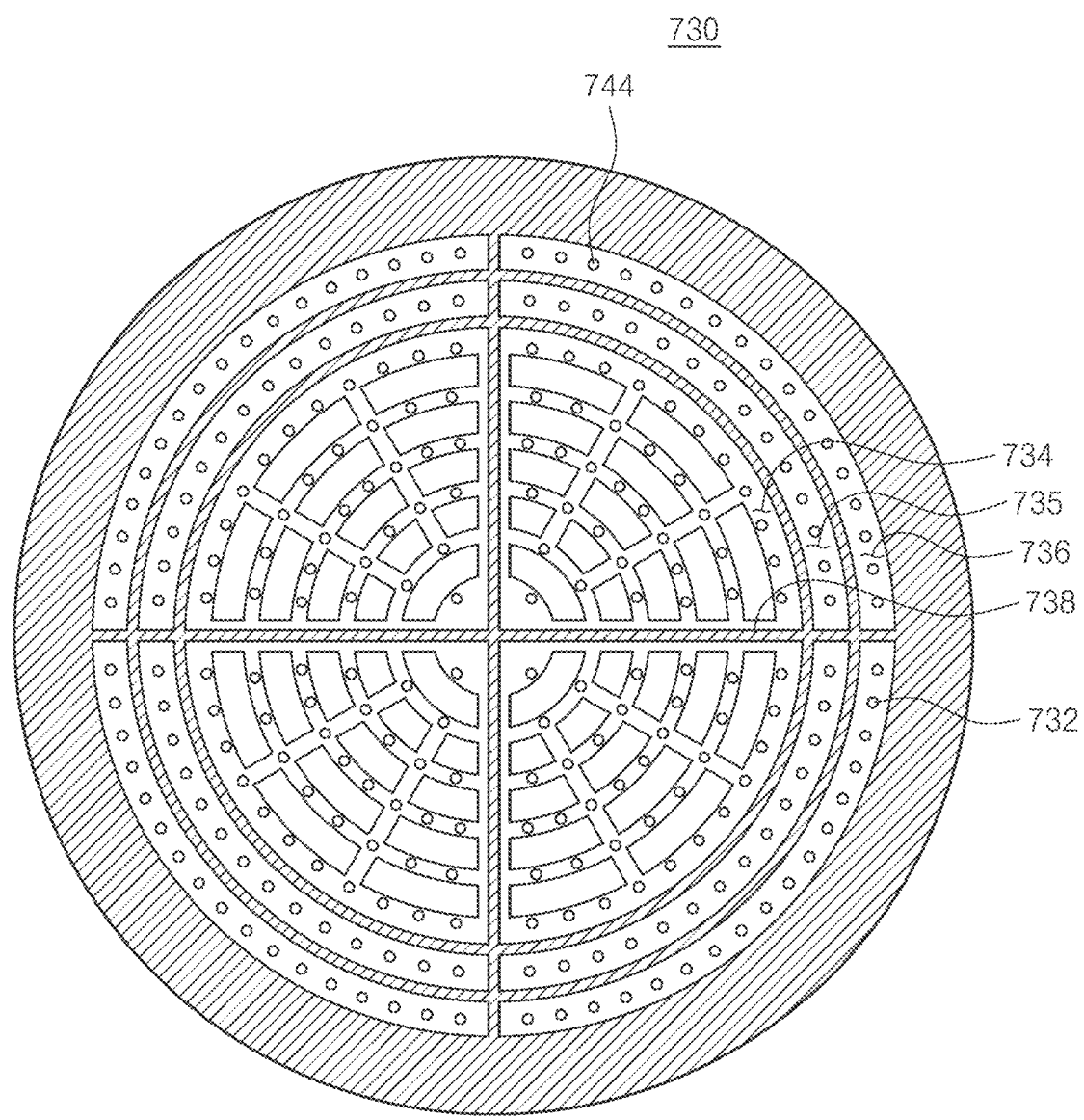
FIG. 6 is a plan view showing a distribution plate of FIG. 5.
Figure 7:
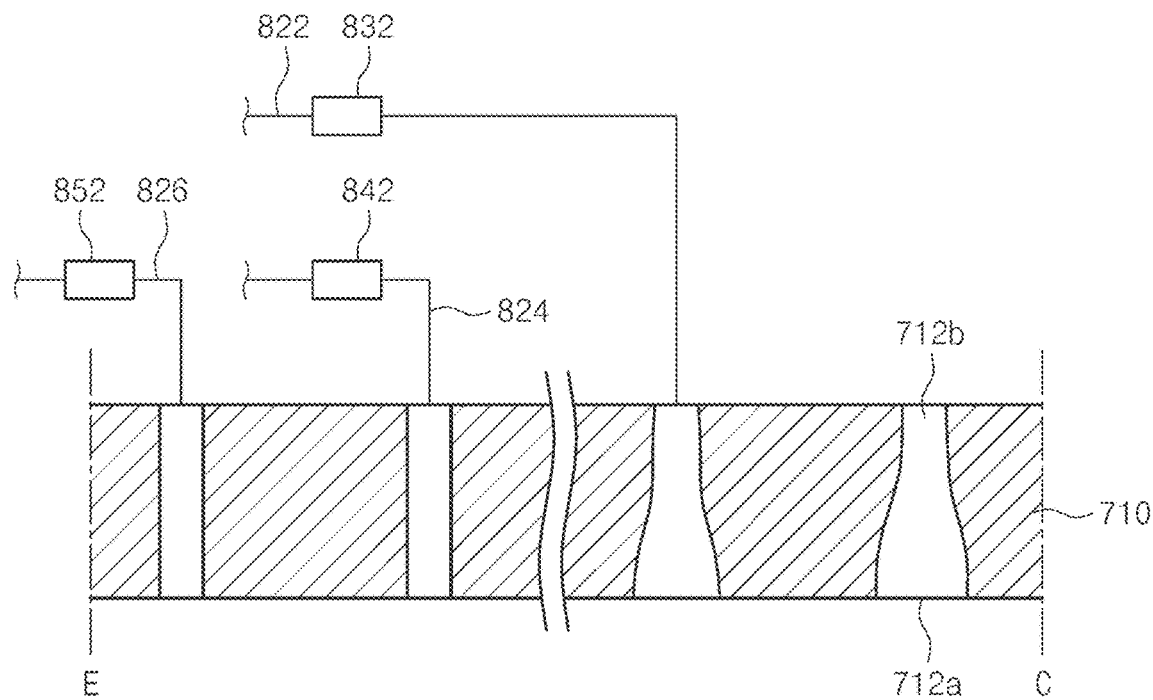
FIG. 7 is an enlarged view showing a discharge hole in each region of FIG. 5.
Figure 8:
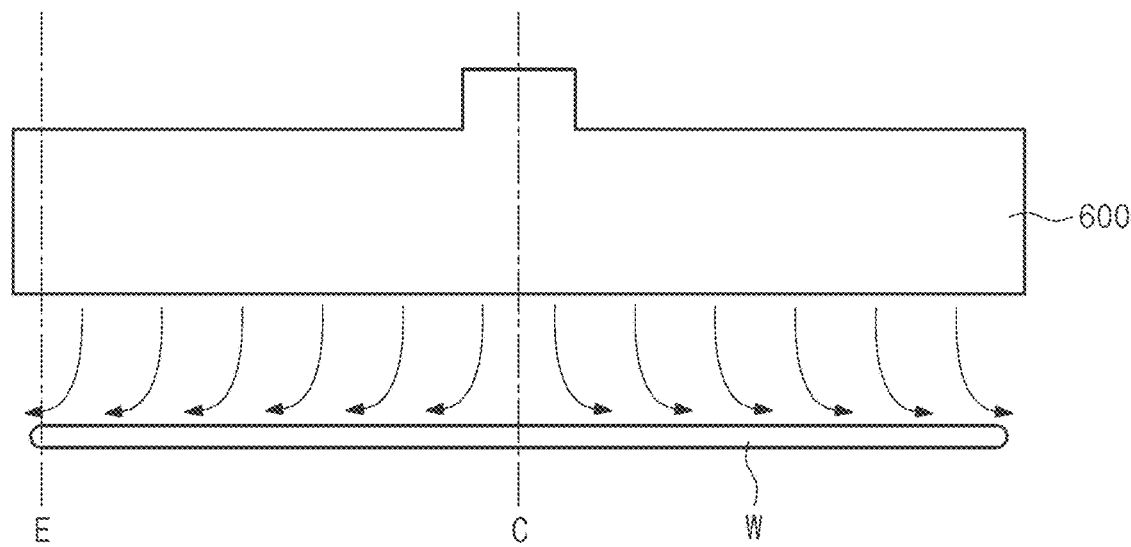
FIG. 8 is a view showing flow of gas discharged from each discharge hole in FIG. 7.

Hereinafter, the shower head unit 600 will be described in more detail. FIG. 5 is a cut perspective view schematically showing the shower head unit in FIG. 3. FIG. 6 is a plan view showing the distribution plate in FIG. 5. Referring to FIG. 5 and FIG. 6, the shower head unit 600 includes a discharge plate 710, a distribution plate 730, and an introducing plate 770. The discharge plate 710, the distribution plate 730, and the introducing plate 770 are sequentially and vertically upwards stacked in this order.

The discharge plate 710 has a plate shape. For example, the discharge plate 710 may have a disc shape. The discharge plate 710 has a bottom surface exposed to the treating space. The plurality of discharge holes 712 are formed in the discharge plate 710. Each discharge hole 712 extends in the vertical direction. The process gas is supplied to the treating space through the discharge holes 712. The discharge hole 712 extends from a bottom surface to a top surface of the discharge plate 710. The discharge holes 712 have the same diameter along a length direction of the plate 710. For example, a portion of the discharge hole 712 corresponding to a bottom surface of the discharge plate 710 is defined as a discharge end 712a, and a portion of the discharge hole 712 corresponding to a top surface of the discharge plate 710 is defined as an inner end 712b. The discharge end 712a is exposed to the process gas more frequently than the inner end 712b is. Thus, the former is etched by the gas at a larger amount than the latter is. Accordingly, the discharge end 712a may have a larger diameter than that of the inner end 712b.

The distribution plate 730 heats the process gas and distributes the headed gas to the discharge holes respectively located in the regions. The distribution plate 730 is located above the discharge plate 710. The distribution plate 730 includes an upper plate 740, a partitioning plate 738, and a heater 750. The upper plate 740 has a partial disc shape partially similar to the discharge plate 710. The upper plate 740 have different regions having different heights. A bottom surface of the upper plate 740 has an edge region having a vertical level different from that of a central region thereof. The bottom surface of the upper plate 740 may have an edge region having a vertical level higher than that of the central region. Accordingly, the upper plate 740 may have the bottom surface whose the edge region has a stepped shape. The central region of the bottom surface of the upper plate 740 faces the discharge plate 710 and has a size corresponding to the discharge plate 710. A plurality of extended holes 744 are formed in a central region of the upper plate 740. The upper plate 740 is in contact with a top surface of the discharge plate 710. The number of the extended holes 744 is equal to the number of the discharge holes 712. The upper plate 740 is positioned such that the extended holes 744 and the discharge holes 712 coincide with each other when viewed from above. Each of the extended holes 744 is formed in a stepwise manner so that a width of a bottom end thereof is smaller than that of a top end. Therefore, when viewed laterally, a combination of each extended hole 744 and each discharge hole 712 constitutes a single elongate hole extending from a top of the upper plate 740 to a bottom of the discharge plate 710.

The partitioning plate 738 extends upward from a top surface of the upper plate. The partitioning plate 738 divides the top surface of the upper plate into a plurality of partition regions. The partitioning plate 738 is embodied as a plurality of concentric rings. The partitioned regions may include a first region 734, a second region 735, and a third region 736. The first region 734 is a region containing a center, the second region 735 is a region surrounding the first region 734, and the third region 736 is a region surrounding the second region 735. Each region is embodied as a space defined by the upper plate, the partitioning plate 738, and the introducing plate 770.

The heater 750 is located inside the upper plate 740. For example, the heater 750 may be embodied a heating wire. The heater 750 may be embodied as a coil in a spiral shape.

An introduction plate 770 supplies the process gas supplied from a gas supply line to each region of the distribution plate 730. The introducing plate 770 is stacked on a top face of the upper plate 740. The introducing plate 770 has a disc shape having a size corresponding to a size of the top surface of the upper plate 740. The introducing plate 770 and the upper plate 740 may be fastened to each other via bolts and may be in close contact with each other. A plurality of introduction lines are formed in the introduction plate. A plurality of introduction lines are embodied as independent lines, and correspond to the regions of the distribution plate 730 respectively. The upper electrode 420 is stacked on a top face of the introducing plate 770. The upper electrode 420 may generate an electromagnetic field with the lower electrode.

A cooling member is disposed in the introduction plate 770. The cooling member has a cooling fluid channel 790 formed inside the introducing plate 770. The cooling fluid channel 790 is embodied as a passage through which cooling water or cooling fluid flows. Cooling water or cooling fluid prevents the distribution plate 730 and the discharge plate 710 from being heated to a temperature above a limit temperature.

The gas block 800 supplies the process gas to each region of the distribution plate 730 and is installed on the shower head unit 600. In this embodiment, the gas block 800 is installed on the upper electrode 420. The gas block 800 includes a body 820 and a plurality of adjusters. The body 820 has a fluid channel extending from an introduction end to a plurality of branching ends defined therein. The fluid channel may extend from the introduction end, then branch from branch points and extend to the branching end. The adjusters are respectively installed in the fluid channels branching from the branch points and extending to the branching end. For example, a fluid channel connected to the first region 734 may be defined as a first fluid channel 822, and a fluid channel connected to the second region 735 may be defined as a second fluid channel 824, and a fluid channel connected to the third region 736 may be defined as a third fluid channel 826. Each adjuster adjusts a flow rate of the process gas flowing in each fluid channel. The adjusters may adjust the flow rate of the process gas so that the flow rates of the process gases to be supplied to the regions are different from each other. For example, a first adjuster 832 is installed in the first fluid channel 822, a second adjuster 842 is installed in the second fluid channel 824, and a third adjuster 852 is installed in the third fluid channel 826. For convenience of description, a flow rate of the process gas flowing in the fluid channel is defined as a supply flow rate. A flow rate of the process gas discharged from discharge hole 712 is defined as discharge flow rate.

The controller 900 controls the adjusters 832, 842, and 852 independently. The discharge holes 712 may have different sizes due to damage or deformation of the discharge holes 712. Thus, the discharge holes 712 may have different flow rates. Thus, the controller 900 controls the adjusters 832, 842, and 852 to compensate for the difference between the discharge rates of the discharge holes 712 in the regions. In one example, the controller 900 may allow the supply flow rates of the process gases to be supplied to the different regions to be different from each other so that the discharge flow rates of the process gases to be discharged from the discharge holes 712 may be uniform. The controller 900 may increase the supply flow rate of the process gas as as the diameter of a corresponding discharge hole 712 increases, thereby to compensate for decrease of the discharge flow rate occurring when the diameter of the discharge hole 712 increases.

When the shower head unit 600 is set up in the chamber, the discharge holes 712 have the same diameter. However, during the procedure of treating multiple substrates W, the process gas is discharged hundreds to tens of thousands of times. Thus, the process gas etches the discharge plate 710 during the discharging procedure. Moreover, when viewed from above, a portion of the treating space facing the first region 734 has a higher plasma density than those of other portions thereof. Accordingly, the discharge hole 712 connected to the first region 734 has a higher degree of damage than that of each of the discharge holes 712 connected to the second region 735 and the third region 736. As a cumulative number of process times increases, the discharge hole 712 connected to the first region 734 has a larger diameter than those of other discharge holes 712. The controller 900 may control the adjusters to supply the process gas flowing in the first fluid channel 822 at a flow rate that is greater than that of the process gas flowing in the second fluid channel 824. Thus, the discharge flow rates from the discharge hole 712 corresponding to the first region 734 and from another discharge hole 712 corresponding to another region may be uniform.

Hereinafter, a procedure for treating the substrate W using the substrate treating apparatus as described above will be described. The shower head unit having the discharge holes 712 of the same diameter defined therein is installed in the chamber. First substrate to N-th substrate are sequentially treated using the process gas. When treating the first substrate using the gas, the supply flow rates of the first fluid channel 822, the second fluid channel 824, and the third fluid channel 826 are equal to each other. The discharge holes 712 have the same diameter, such that the process gas is discharged at a uniform discharge flow rate between the regions. During treatment of multiple substrates W, the discharge plate 710 is etched by the process gas. Accordingly, each of the discharge holes 712 has a larger diameter than when treating the first substrate. Therefore, when treating the N-th substrate, the supply flow rate of the gas to be supplied to each region is greater than when treating the first substrate. Thus, the process gas to be discharged to the first substrate and the process gas to be discharged to the N-th substrate may be discharged at the same discharge flow rate.

Moreover, the discharge holes 712 have different amounts of etching based on positions thereof. For example, the discharge hole 712 located in the central region has a greater amount of etching than those of other regions. This means that the central region of the treating space has a higher gas density than those of the other regions, so that the discharge hole 712 of the central region may have a greater amount of etching than those of the other regions. Accordingly, the discharge hole 712 in the central region has a larger diameter than that of the discharge hole 712 in another region. Therefore, the supply flow rate of the process gas to be supplied to the first region 734 may be controlled to be higher than the supply flow rate of the process gas to be supplied to each of the other regions. Accordingly, the discharge rate of the process gas to be discharged from the discharge hole 712 in the central region may be equal to that of the process gas to be discharged from the discharge hole 712 in each of the other regions.

According to an embodiment of the inventive concept, even when the sizes of the discharge holes corresponding to the different regions are different from each other, compensating for the difference between the flow rates of the gases to be supplied to the discharge holes may allow the discharge rates of the gas to be uniform between the different regions.

The effect of the inventive concept is not limited to the above-described effects. Effects not mentioned will be clearly understood by those skilled in the art from the present specification and the accompanying drawings.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method for treating a substrate, the method comprising:

discharging a process gas from first and second partitioned regions defined in a shower head toward a substrate, to treat the substrate using the process gas, individually adjusting a first flow rate of the process gas to be supplied to the first partitioned region and a second flow rate of the process gas to be supplied to the second partitioned region to be different from each other, in consideration of damage or deformation of discharge holes in each of the first and second partitioned regions, to compensate for a difference between discharge rates of the process gas discharged from the discharge holes between the first and second partitioned regions such that the discharge rates of the process gas from the discharge holes in the first and second partitioned regions are same.

2. The method of claim 1, wherein when viewed from above, the first partitioned region contains a center, and the second partitioned region surrounds the first partitioned region, the individually adjusting adjusts the first flow rate to be higher than the second flow rate.

3. The method of claim 2, wherein the substrate includes first to N-th substrates (n is a natural number larger than 2), wherein treating the substrate using the process gas includes treating the first to N-th substrates sequentially using the process gas, and the first flow rate during a process for treating the N-th substrate is controlled to be higher than the first flow rate during a process for treating the first substrate.

4. The method of claim 3, wherein the second flow rate during the process for treating the N-th substrate is controlled to be higher than the second flow rate during the process for treating the first substrate.

5. The method of claim 1, wherein the process gas includes etching gas to etch the substrate.

* * * * *